United States Patent
Chatty et al.

(10) Patent No.: US 7,737,498 B2
(45) Date of Patent: Jun. 15, 2010

(54) ENHANCED STRESS-RETENTION SILICON-ON-INSULATOR DEVICES AND METHODS OF FABRICATING ENHANCED STRESS RETENTION SILICON-ON-INSULATOR DEVICES

(75) Inventors: Kiran V. Chatty, Williston, VT (US); Robert J. Gauthier, Jr., Hinesburg, VT (US); Jed Hickory Rankin, Richmond, VT (US); Robert R. Robison, Colchester, VT (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/116,237

(22) Filed: May 7, 2008

(65) Prior Publication Data

US 2009/0278201 A1     Nov. 12, 2009

(51) Int. Cl.
  *H01L 21/00*   (2006.01)
  *H01L 21/338*  (2006.01)
(52) U.S. Cl. ............... 257/347; 438/151; 257/E21.424
(58) Field of Classification Search ............... 257/347, 257/118, 336, 411, 408, E21.43, E29.193, 257/E29.051, E29.277, E29.255, E21.424, 257/E21.426; 438/938, 514, 521, 458, 527, 438/151
See application file for complete search history.

(56) References Cited

U.S. PATENT DOCUMENTS

| | | | |
|---|---|---|---|
| 5,442,223 A | 8/1995 | Fujii | |
| 6,566,712 B2 | 5/2003 | Hayashi et al. | |
| 6,621,131 B2 * | 9/2003 | Murthy et al. | 257/408 |
| 6,707,106 B1 | 3/2004 | Wristers et al. | |
| 6,717,216 B1 | 4/2004 | Doris et al. | |
| 6,917,078 B2 | 7/2005 | Bhattacharyya | |
| 7,276,406 B2 | 10/2007 | Chen et al. | |
| 2004/0070312 A1 * | 4/2004 | Penunuri et al. | 310/313 A |
| 2005/0247986 A1 * | 11/2005 | Ko et al. | 257/411 |
| 2006/0189053 A1 * | 8/2006 | Wang et al. | 438/197 |

OTHER PUBLICATIONS

G. Lehmann et al., "Young's modulus and density of . . . ", 2002, Appl. Phys., vol. A74, pp. 41-45.*
G. Este and W.D. Westwood, "Stress control in reactivity sputtered AlN and TiN films", 2987), J. Vac. Sci.Technol., vol. A5 (4), pp. 1892-1897.*

* cited by examiner

*Primary Examiner*—Thomas L Dickey
*Assistant Examiner*—Nikolay Yushin
(74) *Attorney, Agent, or Firm*—Schmeiser, Olsen & Watts; W. Riyon Harding

(57) ABSTRACT

Field effect transistor and methods of fabricating field effect transistors. The field effect transistors includes: a semiconductor substrate; a silicon oxide layer on the substrate; a stiffening layer on the silicon oxide layer; a single crystal silicon layer on the stiffening layer; a source and a drain on opposite sides of a channel region of the silicon layer; a gate electrode over the channel region and a gate dielectric between the gate electrode and the channel region.

20 Claims, 7 Drawing Sheets ations of the present invention.

ENHANCED STRESS-RETENTION SILICON-ON-INSULATOR DEVICES AND METHODS OF FABRICATING ENHANCED STRESS RETENTION SILICON-ON-INSULATOR DEVICES

FIELD OF THE INVENTION

The present invention relates to the field of semiconductor devices; more specifically, it relates to devices and methods of manufacturing devices formed on silicon-on-insulator substrates, the devices having enhanced ability to retain stress induced by the manufacturing process.

BACKGROUND OF THE INVENTION

There is an ongoing need in the industry to decrease the size of semiconductor devices such as field effect transistors in order to increase performance (speed) and decrease power consumption. One method to increase speed is to fabricate the field effect transistors from silicon-on-insulator substrates. Another method to increase speed is to adjust the strain (from either compressive stress or tensile stress) on the semiconductor portions of the field effect transistor. While these provide benefits to transistor performance, an even greater speed increase for field effect transistors in future applications beyond that attainable today is still required. Accordingly, there exists a need in the art to overcome the deficiencies and limitations described hereinabove.

SUMMARY OF THE INVENTION

A first aspect of the present invention is a field effect transistor, comprising: a semiconductor substrate; a silicon oxide layer on the substrate; a stiffening layer on the silicon oxide layer; a single crystal silicon layer on the stiffening layer; a source and a drain on opposite sides of a channel region of the silicon layer; a gate electrode over the channel region and a gate dielectric between the gate electrode and the channel region.

A second aspect of the present invention is a method of fabricating a field effect transistor, comprising: providing a semiconductor substrate comprising: a silicon oxide layer on a support substrate; a stiffening layer on the silicon oxide layer; and a single crystal silicon layer on the stiffening layer; forming a source and a drain on opposite sides of a channel region of the silicon layer; and forming a gate electrode over the channel region and a gate dielectric between the gate electrode and the channel region.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Young's modulus (E) is a measure of stiffness. It is also known as the Young modulus, modulus of elasticity, elastic modulus or tensile modulus (the bulk modulus and shear modulus are different types of elastic modulus). It is defined as the ratio, for small strains, of the rate of change of stress with strain. Stress is a measure of the average amount of force exerted per unit area. Stress is a measure of the intensity of the total internal forces acting within a body across imaginary internal surfaces, as a reaction to external applied forces and body forces. Strain is the geometrical expression of deformation caused by the action of stress on a physical body.

In n-channel field effect transistors (NFETs), the mobility of the majority carriers, electrons, is greater (hole mobility is less) when the channel is in tensile stress in the direction of current flow (from source to drain) and to a similar extent when the channel is in compressive stress in a direction perpendicular to current flow. In p-channel field effect transistors (PFETs) the mobility of the majority carriers, holes, is greater than (electron mobility is less) when the channel region is in compressive stress in the direction of current flow (from source to drain) and to a lesser extent when the channel is in tensile stress in a direction perpendicular to current flow. Increasing the mobility of majority carriers increase the performance of the device.

Figure 1A:
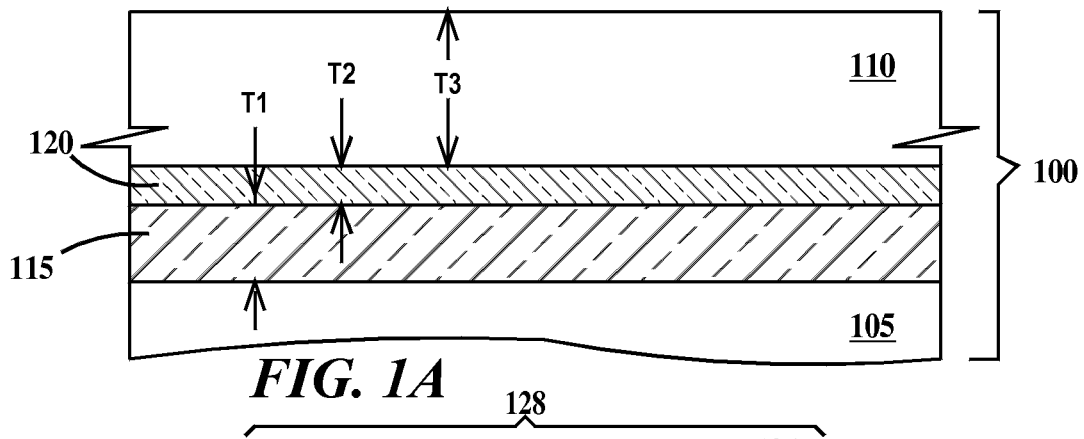
FIGS. 1A through 1H are cross-sectional drawings illustrating fabrication of Field effect transistors according to a first embodiment of the present invention.

FIGS. 1A through 1H are cross-sectional drawings illustrating fabrication of field effect transistors according to a first embodiment of the present invention. In FIG. 1A, a silicon-on-insulator (SOI) substrate includes a base semiconductor substrate 105 and a single-crystal silicon layer 110 separated by a buried oxide (BOX layer) 115 and a stiffening layer 120. In the example of FIG. 1A, silicon layer 110 is directly on stiffening layer 120, stiffening layer 120 is directly on BOX layer 115 and BOX layer 115 is directly on base substrate 105. However, there may be a thin (less than about 3 nm thick) interface film(s) between BOX layer 115 and stiffening layer 120 caused by the fabrication process. For example the interface film may comprise silicon oxide or silicon oxynitride or both when stiffening layer 120 is silicon nitride and the BOX layer silicon oxide. In one example, stiffening layer 120 has a Young's modulus greater than that of silicon oxide and particularly greater than BOX layer 115. The Young's modulus for silicon dioxide is between about 46 GPa and about 75 GPa (giga-Pascals). In one example, stiffening layer 120 has a Young's modulus greater than about 168 GPa. In one example, stiffening layer 120 is in neutral stress. In one example, the stress in stiffening layer 120 is between −200 MPa (mega-Pascals) compressive stress and 200 MPa tensile stress. If PFETs are to be formed in silicon layer 110 it is advantageous that the internal stress in stiffening layer 120 be neutral or slightly tensile (i.e., between about 0 MPa and about 200 MPa). If NFETs are to be formed in silicon layer 110 it is advantageous that the internal stress in stiffening layer 120 be neutral or slightly compressive (i.e., between about 0 MPa and about −200 MPa).

In one example, base substrate 105 is silicon. In one example, BOX layer 115 is silicon dioxide. In one example, BOX layer 115 is silicon dioxide and has a thickness of T1 where T1 is between about 100 nm and about 300 nm thick. In one example, stiffening layer 120 is silicon nitride. In one example, stiffening layer 120 has a thickness of T2 where T2 is between about 10 and 30 nm thick. In one example, silicon layer 110 has a thickness T3 where T3 is between about 50 nm and about 150 nm thick. If PFETs are to be formed in silicon layer 110, it is advantageous that silicon layer 110 be doped N-type. If NFETs are to be formed in silicon layer 110, it is advantageous that silicon layer 110 be doped P-type.

Figure 1B:
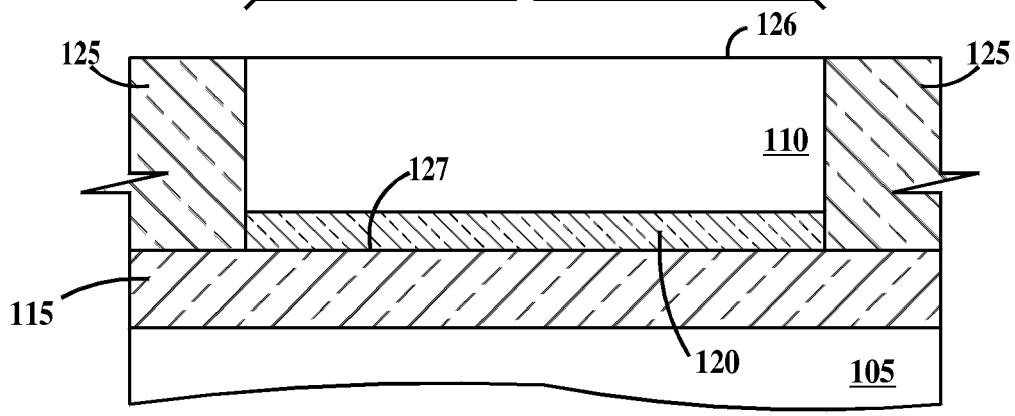

In FIG. 1B, shallow trench isolation (STI) 125 is formed in silicon layer 110 and stiffening layer 120. STI 125 extends from a top surface 126 of silicon layer 110, through stiffening layer 120 to a top surface 127 of BOX layer 115. STI 125, when seen in top view completely surrounds a perimeter of a region 128 of silicon layer 110, electrically isolating region 128 from other regions of silicon layer 110. Region 128 of silicon layer 110 defines a body of a FET being fabricated. It is advantageous that no silicon oxide layer intervene between silicon layer 110 and stiffening layer 120, because silicon, dioxide, having a Young's modulus less than that of silicon will negate the stiffening effect of stiffening layer 120.

Figure 1C:
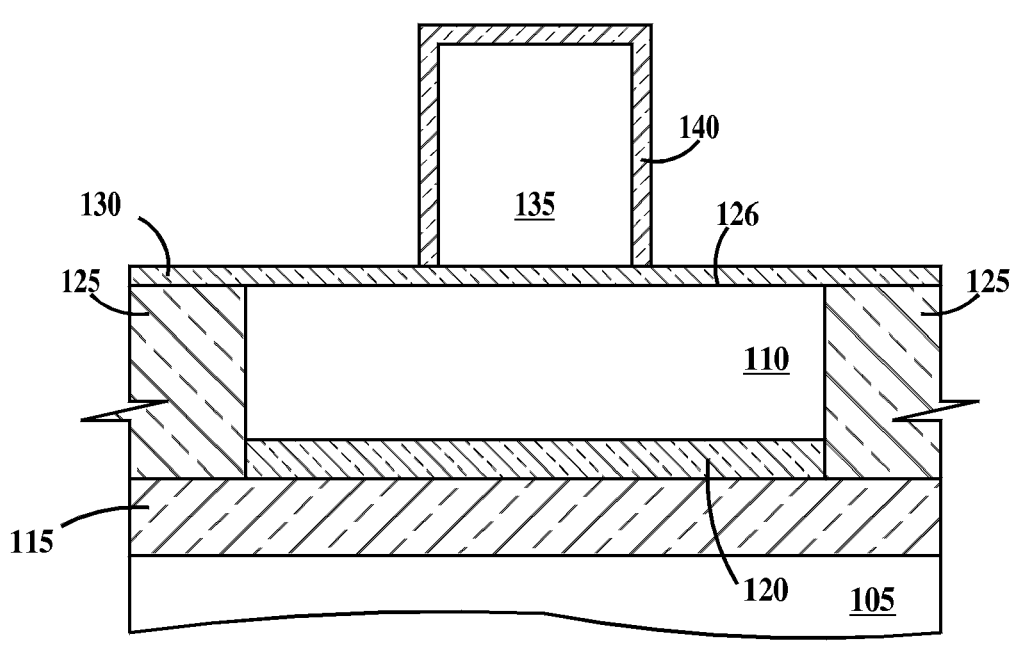

In FIG. 1C, a gate dielectric layer 130 is formed on top surface 127 of silicon layer 110, a polysilicon gate electrode 135 is formed on the gate dielectric layer and a protective layer (in one example, oxide) is formed on exposed surfaces (e.g., the sidewalls and top) of the gate electrode.

Figure 1D:
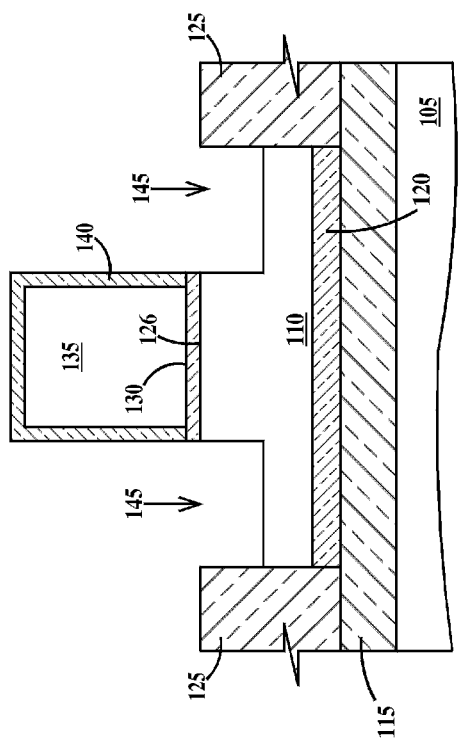

In FIG. 1D, trenches 145 are etched in silicon layer 110 on either side of gate electrode 135. The horizontal extent of trenches 145 is defined by gate electrode, 135, protective layer 140 and STI 125. A horizontal direction is defined a direction parallel to top surface 126 of silicon layer 110.

Figure 1E:
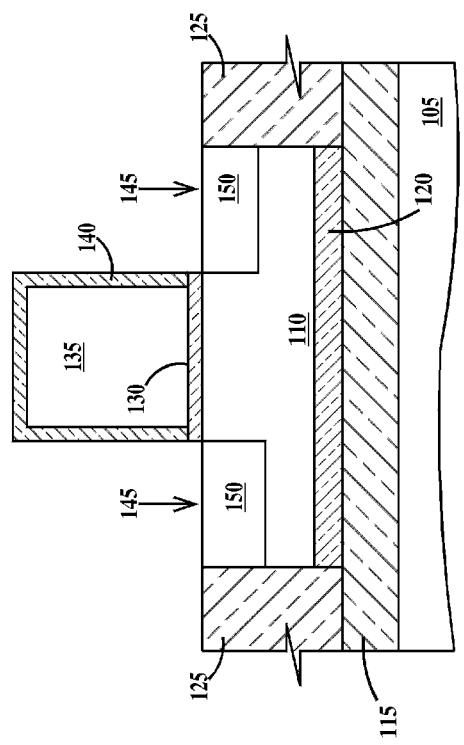

In FIG. 1E, trenches 145 are filled with a strain material to form strained regions 150 in silicon layer 110. In one example, for a PFET, strained regions 150 are in tensile stress, which transfers to silicon layer 110. In one example, for a PFET, strained regions 150 comprise silicon germanium (SiGe) and the stress is generated from lattice mismatch, SiGe having a greater lattice constant than silicon (Si) is in internal compressive stress. In one example, for an NFET, strained regions 150 are in tensile stress, which transfers to silicon layer 110. In one example, for an NFET, strained regions 150 comprise silicon carbide (SiC) and the stress is generated from lattice mismatch, SiC having a smaller lattice constant than Si is in internal tensile stress.

Figure 1F:
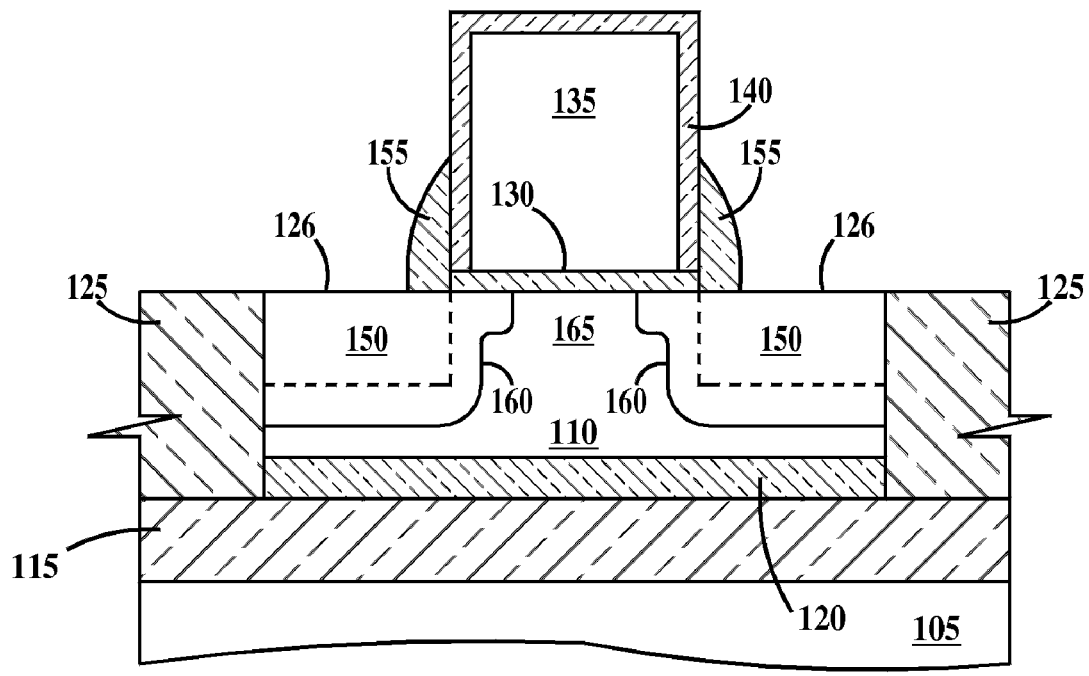

In FIG. 1F, dielectric spacers 155 are formed on protective layer 140 over the sidewalls of gate electrode 135 and one or more ion implantations are performed to form source/drains 160 in silicon layer 110 on opposite sides of gate electrode 135. Source drains 160 are separated by a channel region 165 of silicon layer 110. In FIG. 1F, strained region 160 is illustrated by the dashed lines and source drains 160 extend past strained regions 150 from top surface 126 toward stiffening layer 110, but do not contact the stiffening layer. Strained regions 150 are doped simultaneously with the formation of source/drains 160 by the aforementioned one or more ion implantations. For a PFET, source/drain regions 160 have a net doping type of P. For an NFET, source/drain regions 160 have a net doping type of N.

Figure 1G:
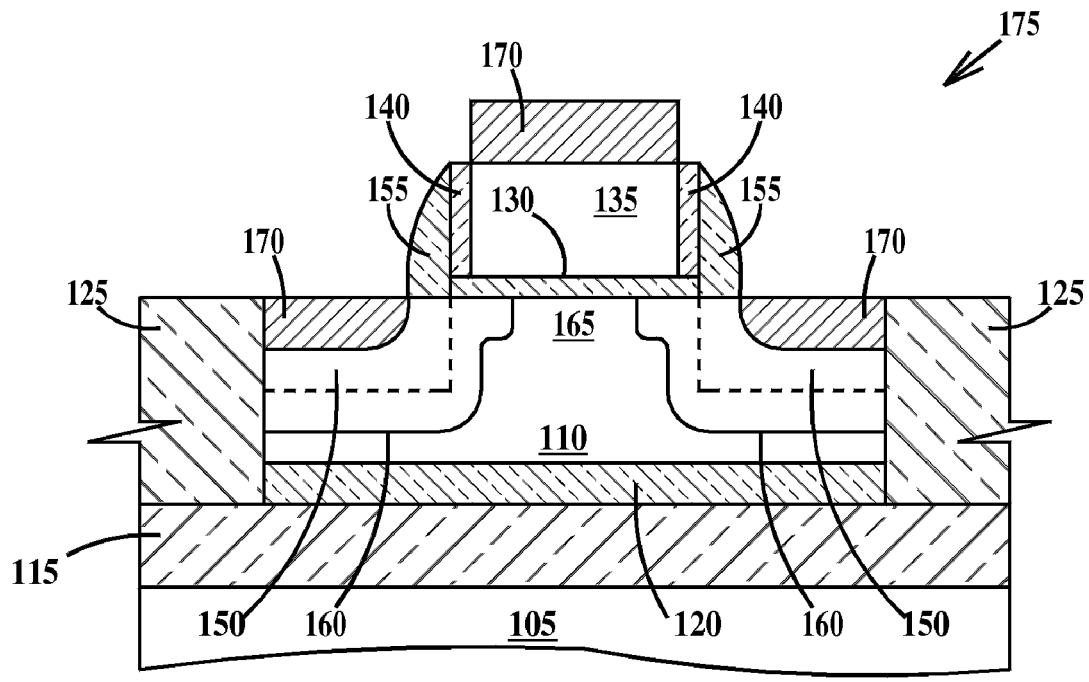

In FIG. 1G, metal silicide regions 170 are formed in an upper region of gate electrode 135 and source/drain regions 160. Metal suicides are formed by depositing a layer of metal on the exposed surfaces of the structure of FIG. 1F, heating the metal to cause a reaction with exposed polysilicon silicon (or other electrically conductive silicon containing materials such as silicon germanium or silicon carbide, but not exposed silicon containing dielectrics such as silicon dioxide and silicon nitride), and then removing the unreacted metal. Note, that there is a layer of polysilicon remains under silicide region 170 over gate electrode 135 and that a region of strain layer 150 remains under the silicide in source/drain regions 160 after silicide formation. Thus an FET 175 comprising a body region (of silicon layer 110), source/drain regions 160, strain regions 150, channel region 165, gate dielectric layer 130, gate electrode 136 and silicide regions 170 has bee formed.

Figure 1H:
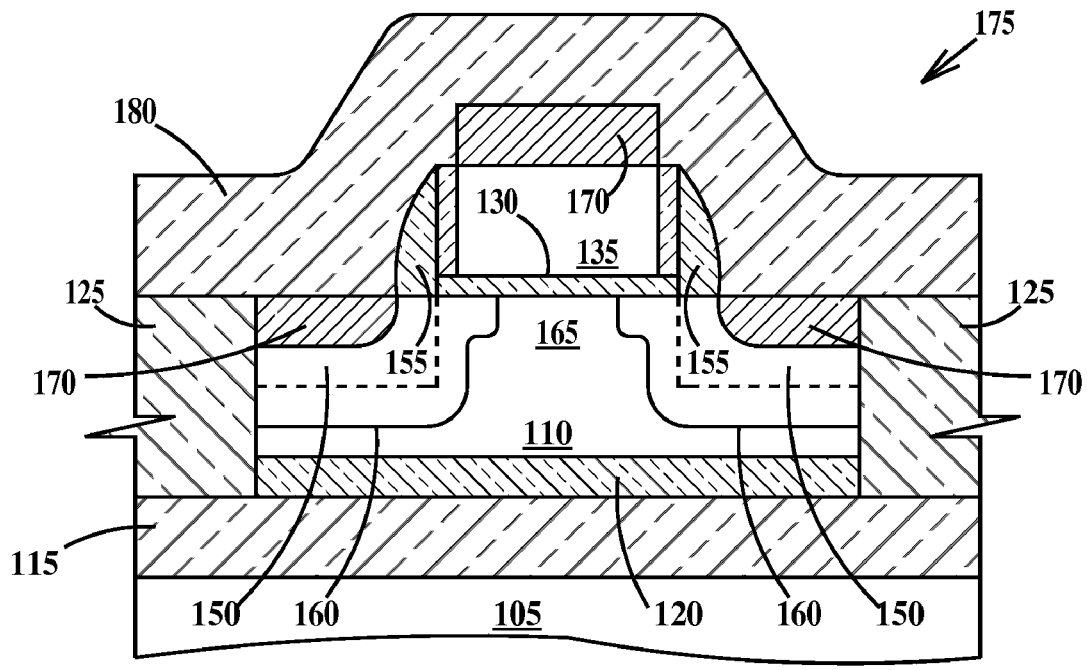

In FIG. 1H, a stress layer 180 is formed over FET 175. For a PFET, stress layer 180 is in compressive stress. In one example, for a PFET, stress layer 180 comprises internally compressive stressed silicon nitride. For an NFET, stress layer 180 is in tensile stress. In one example, for an NFET, stress layer 180 comprises internally tensile stressed silicon nitride.

Figure 2:
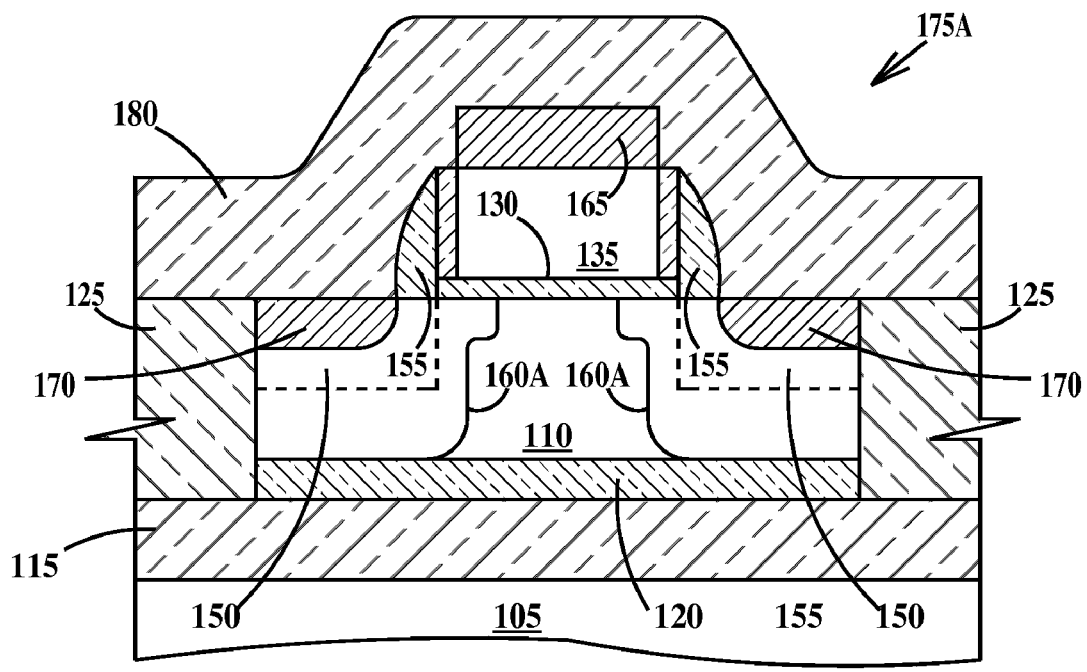
FIG. 2 is a cross-section through Field effect transistors fabricated by changing the process illustrated in FIG. 1F according to a second embodiment of the present invention.

FIG. 2 is a cross-section through field effect transistors fabricated by changing the process illustrated in FIG. 1F according to a second embodiment of the present invention. In FIG. 2, an FET 175A differs from FET 175 of FIG. 1H in that source/drains 160 of FIG. 1H are replaced by source/drains 160A in FIG. 2. Source drains 160A abut stiffening layer 120. In FIG. 1H, source/drains 160 do not abut stiffening layer 120.

Figure 3A:
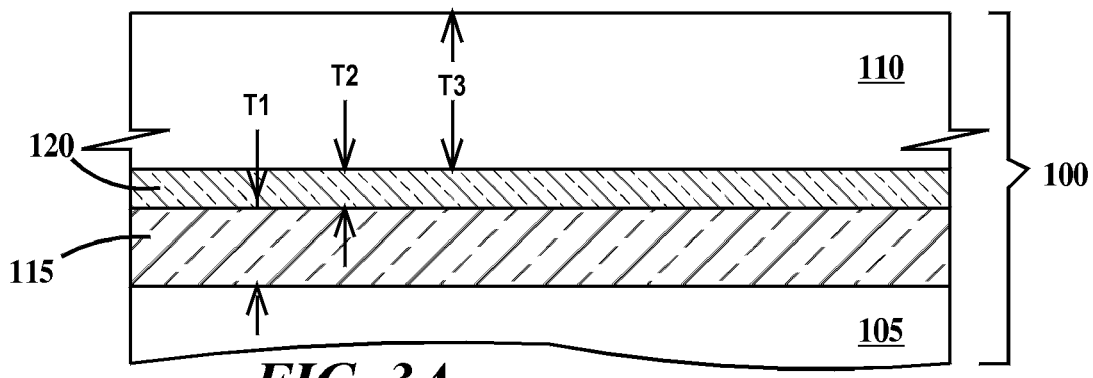
FIGS. 3A through 3F are cross-sectional drawings illustrating fabrication of Field effect transistors according to a third embodiment of the present invention.
Figure 3B:
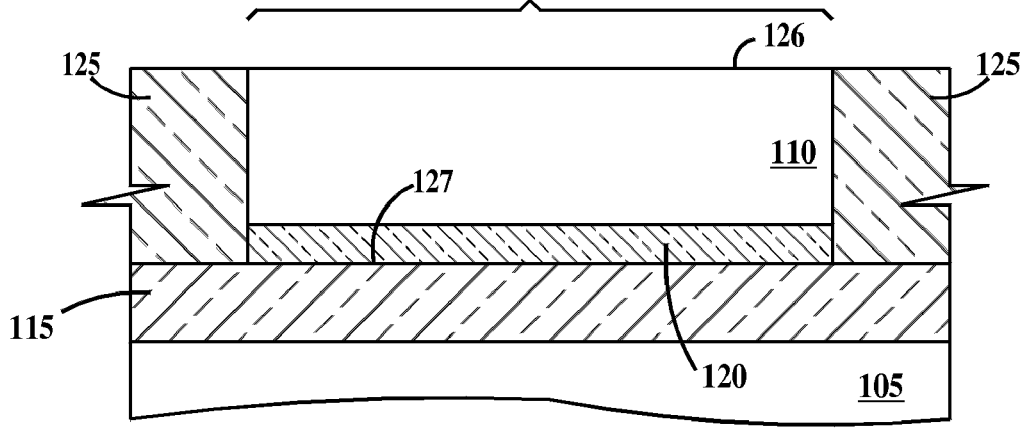
Figure 3C:
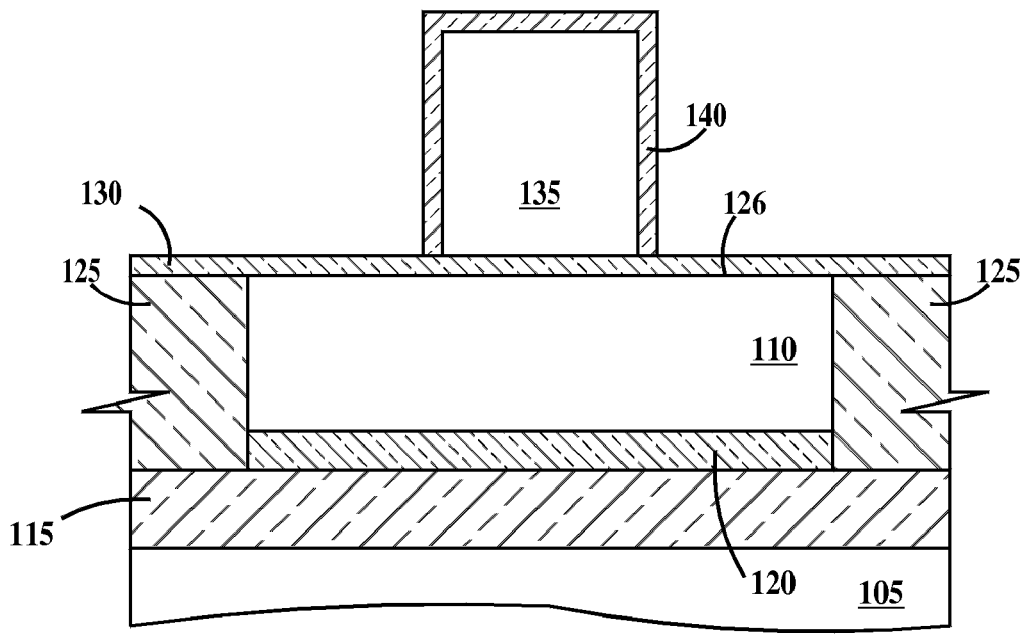
Figure 3D:
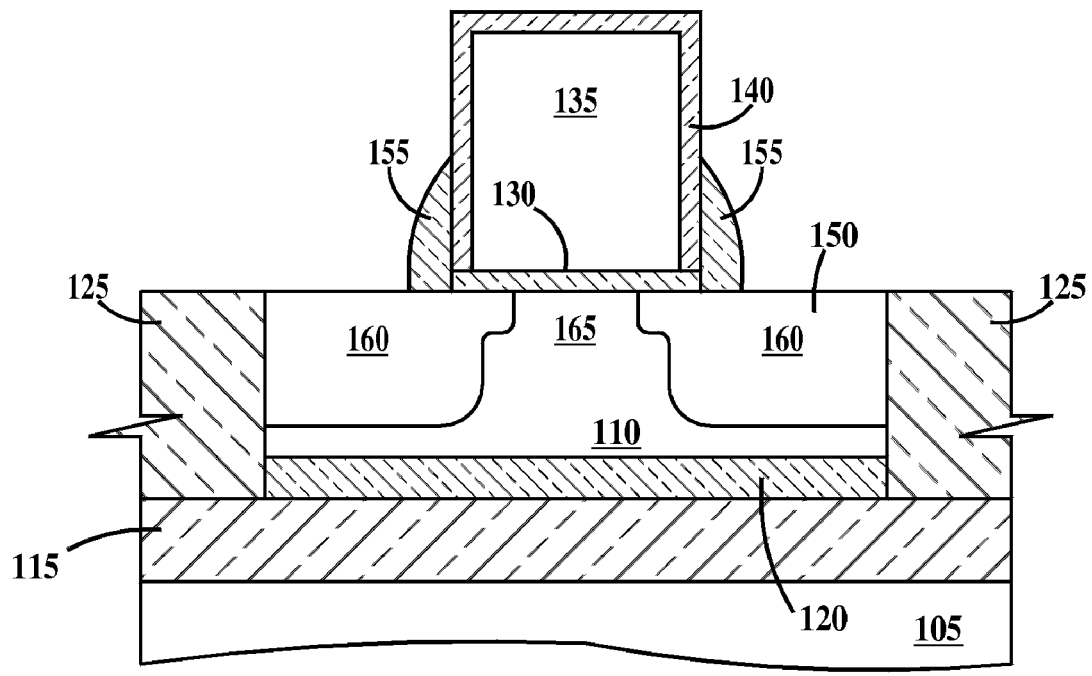

FIGS. 3A through 3F are cross-sectional drawings illustrating fabrication of field effect transistors according to a third embodiment of the present invention. FIGS. 3A, 3B and 3C are similar, respectively, to FIGS. 1A, 1B and 1C described supra. In FIG. 3D, dielectric spacers 155 are formed on protective layer 140 over the sidewalls of gate electrode 135 and one or more ion implantations are performed to form source/drains 160 in silicon layer 110 on opposite sides of gate electrode 135. Source drains 160 are separated by a channel region 165 of silicon layer 110.

Figure 3E:
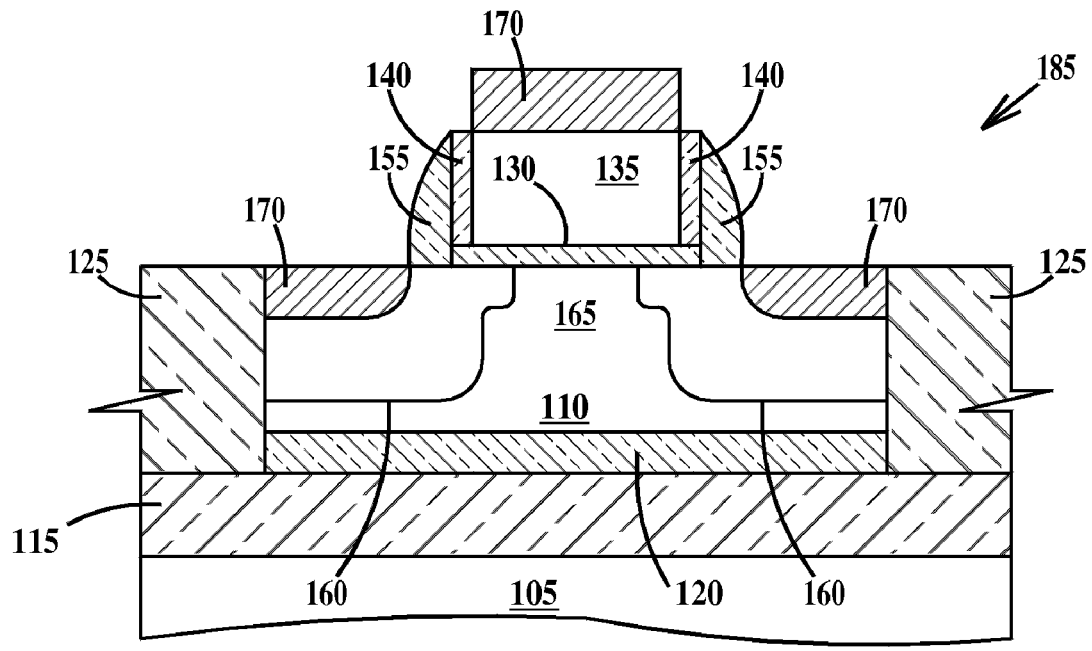
Figure 3F:
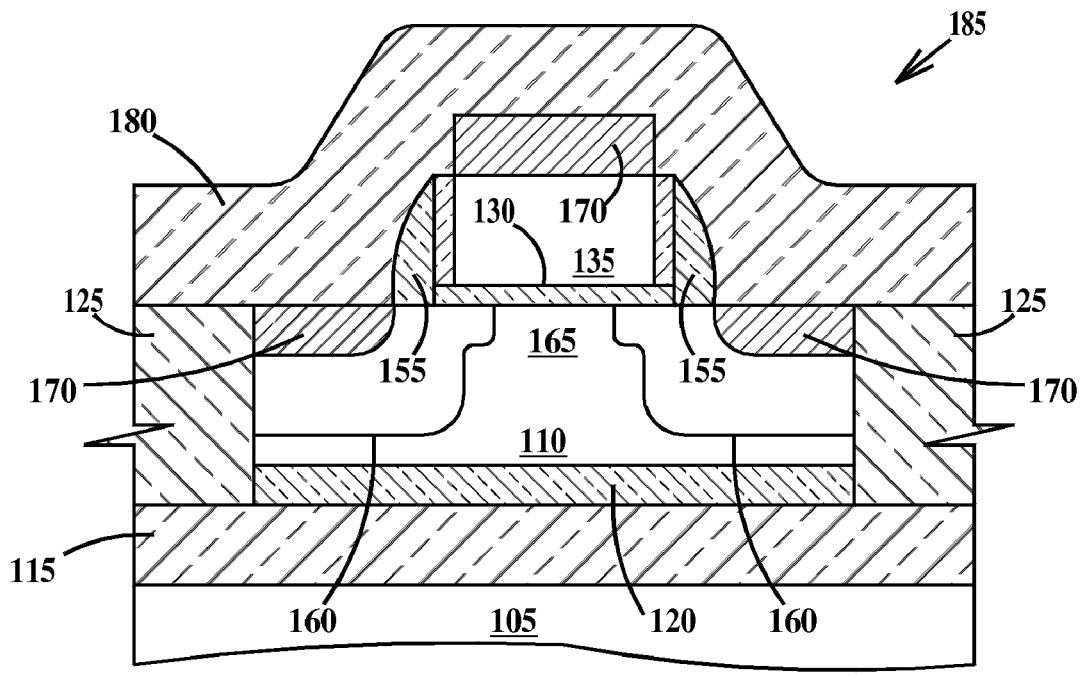

In FIG. 3E, metal silicide regions 170 are formed in upper regions of gate electrode 135 and source/drain regions 160. Note, that there is a layer of polysilicon remains under silicide region 170 over gate electrode 135 and that a region of source/drains 160 remains under the silicide in source/drain regions 160 after silicide formation. Thus an FET 185 comprising a body region (a region of silicon layer 110), source/drain regions 160, channel region 165, gate dielectric layer 130, gate electrode 136 and silicide regions 170 has been formed. In FIG. 3F, stress layer 180 is formed over FET 185.

Figure 4:
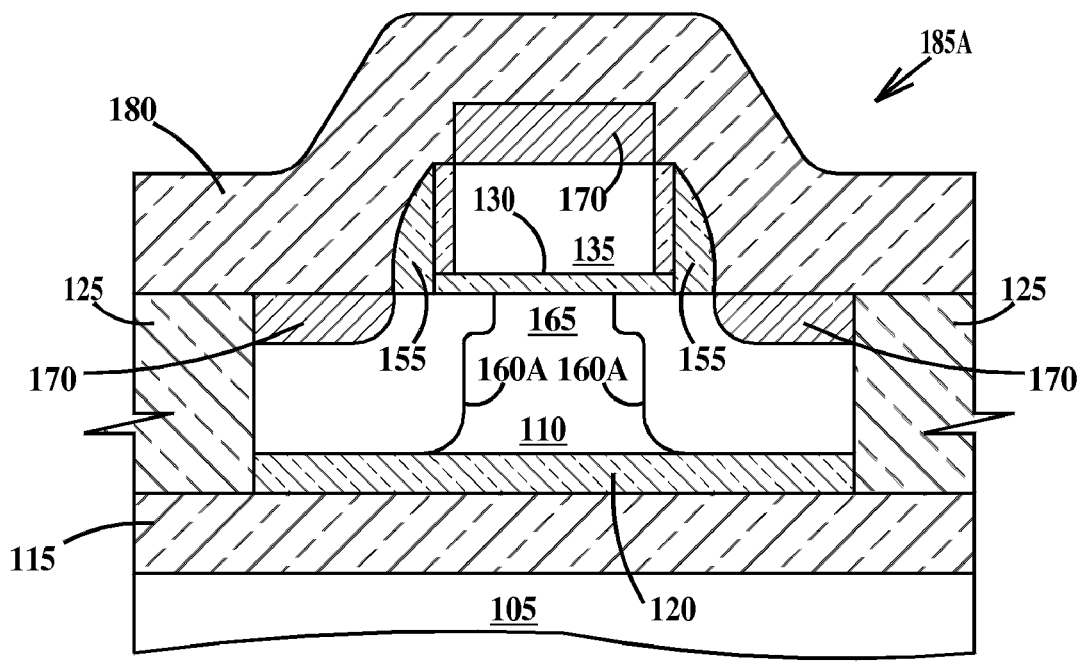
FIG. 4 is a cross-section through Field effect transistors fabricated by changing the process illustrated in FIG. 3D according to a fourth embodiment of the present invention.

FIG. 4 is a cross-section through field effect transistors fabricated by changing the process illustrated in FIG. 3D according to a fourth embodiment of the present invention. In FIG. 4, an FET 185A differs from FET 185 of FIG. 3F in that source/drains 160 of FIG. 3F are replaced by source/drains 160A in FIG. 4. Source drains 160A abut stiffening layer 120. In FIG. 3F, source/drains 160 do not abut stiffening layer 120.

Stress simulations were performed for a PFET having the structure of FIG. 2 and for a PFET having a similar structure to that in FIG. 2 except there was no stiffening layer. In the channel direction (from source to drain and parallel to the top surface of the silicon layer) compressive stress in the channel region increased from about −1.52 E9 Pa without the stiffening layer to about −1.62 E9 Pa with the stiffening layer. In the vertical direction (perpendicular to the top surface of the silicon layer) tensile stress in the channel decreased from about 1.52 E9 Pa without the stiffening layer to about 1.38 E9 Pa with the stiffening layer.

Stress simulations were performed for an NFET having the structure of FIG. 4 and for an NFET having a similar structure to that in FIG. 4 except there was no stiffening layer. In the channel direction (from source to drain and parallel to the top surface of the silicon layer) there was no difference in tensile stress in the channel region with or without the stiffening layer. In the vertical direction (perpendicular to the top surface of the silicon layer) compressive stress in the channel increased from about 3.8 E8 Pa without the stiffening layer to about 4.05 E8 Pa with the stiffening layer.

Thus the embodiments of the present invention overcome the limitations of the art and provide field effect transistors and methods of fabrication strained field effect transistors in silicon-on-insulator technology having enhanced stress retention.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A field effect transistor, comprising:
   a semiconductor substrate;
   a silicon oxide layer on said substrate;
   a stiffening layer on said silicon oxide layer, said stiffening layer having a Young's modulus greater than that of said silicon oxide layer;
   a single crystal silicon layer said stiffening layer;
   a source and a drain on opposite sides of a channel region of said silicon layer;
   a gate electrode over said channel region; and
   a gate dielectric between said gate electrode and said channel region.

2. The transistor of claim 1, further including:
   dielectric isolation extending from a top surface of said silicon layer, through said stiffening layer, to said silicon oxide layer, said dielectric isolation defining a perimeter of a region of said silicon layer containing said source, said drain and said channel region.

3. The transistor of claim 1, wherein said stiffening layer has a Young's modulus greater than 168 GPa.

4. The transistor of claim 1, wherein said stiffening layer is in neutral stress or in a stress between about −200 MPa and about 200 MPa.

5. The transistor of claim 1, further including:
   a stress layer formed over said source, said drain and said gate electrode, said stress layer (i) being in compressive stress if said source and drain are doped P-type and said channel region is doped N-type or (ii) being in tensile stress if said source and drain are doped N-type and said channel region is doped P-type.

6. The transistor of claim 1, wherein said source and said drain do not abut said stiffening layer.

7. The transistor of claim 1, wherein said source and said drain abut said stiffening layer.

8. The transistor of claim 1, further including:
   strain regions formed in said source and drain, said strain regions extending from a top surface of said silicon layer toward said stiffening layer, regions of said source and drain intervening between said strain regions and said stiffening layer, said strain regions (i) being in compressive stress if said source and drain are doped N-type and said channel region is doped P-type or (ii) being in tensile stress if said source and drain are doped P-type and said channel region is doped N-type.

9. The transistor of claim 8, wherein said source and said drain do not abut said stiffening layer.

10. The transistor of claim 8, wherein said source and said drain abut said stiffening layer.

11. A method of fabricating a field effect transistor, comprising:
    providing a semiconductor substrate comprising:
       a silicon oxide layer on a support substrate;
       a stiffening layer on said silicon oxide layer, said stiffening layer having a Young's modulus greater than that of said silicon oxide layer; and
       a single crystal silicon layer on said stiffening layer;
    forming a source and a drain on opposite sides of a channel region of said silicon layer; and
    forming a gate electrode over said channel region and a gate dielectric between said gate electrode and said channel region.

12. The method of claim 11, further including:
    forming dielectric isolation in said semiconductor substrate, said dielectric isolation extending from a top surface of said silicon layer, through said stiffening layer, to said silicon oxide layer, said dielectric isolation defining a perimeter of a region of said silicon layer containing said source, said drain and said channel region.

13. The method of claim 11, wherein said stiffening layer has a Young's modulus greater than 168 GPa.

14. The method of claim 11, wherein said stiffening layer is in neutral stress or in a stress between about −200 MPa and about 200 MPa.

15. The method of claim 11, further including:
    forming a stress layer over said source, said drain and said gate electrode, said stress layer (i) being in compressive stress if said source and drain are doped P-type and said channel region is doped N-type or (ii) being in tensile stress if said source and drain are doped N-type and said channel region is doped P-type.

16. The method of claim 11, wherein said source and said drain do not abut said stiffening layer.

17. The method of claim 11, wherein said source and said drain abut said stiffening layer.

18. The method of claim 11, further including:
    forming strain regions in said source and drain, said strain regions extending from a top surface of said silicon layer toward said stiffening layer, regions of said source and drain intervening between said strain regions and said stiffening layer, said strain regions (i) being in compressive stress if said source and drain are doped N-type and said channel region is doped P-type or (ii) being in tensile stress if said source and drain are doped P-type and said channel region is doped N-type.

19. The method of claim 18, wherein said source and said drain do not abut said stiffening layer.

20. The method of claim 18, wherein said source and said drain abut said stiffening layer.

* * * * *